United States Patent
Horie et al.

Patent Number: 5,461,556
Date of Patent: Oct. 24, 1995

[54] POWER CONVERTER

[75] Inventors: Akira Horie; Yoshio Tsutsui; Takeshi Ando, all of Katsuta; Takayuki Matsui, Hitachi; Eiichi Toyota; Syuuji Saitoo, both of Katsuta, all of Japan

[73] Assignee: Hitachi, Ltd., Tokyo, Japan

[21] Appl. No.: 964,892

[22] Filed: Oct. 22, 1992

[30] Foreign Application Priority Data

Oct. 22, 1991 [JP] Japan .................................. 3-273716

[51] Int. Cl.⁶ .................................................. H02M 7/48
[52] U.S. Cl. ........................................... 363/58; 363/137
[58] Field of Search ..................................... 363/132, 133, 363/55, 56, 57, 58, 137, 135, 136, 138

[56] References Cited

U.S. PATENT DOCUMENTS

| | | | |
|---|---|---|---|
| 3,622,863 | 11/1971 | King . | |
| 4,523,269 | 6/1985 | Baker et al. | 363/138 |
| 4,881,159 | 11/1989 | Holtz et al. | 363/58 |
| 4,924,370 | 5/1990 | Toelle | 363/57 |
| 4,926,306 | 5/1990 | Ueda et al. | 363/58 |

FOREIGN PATENT DOCUMENTS

| | | |
|---|---|---|
| 3823399 | 8/1899 | Germany . |
| 3915510 | 11/1990 | Germany . |
| 4121177 | 1/1992 | Germany . |
| 1-198280 | 9/1980 | Japan . |
| 64-89972 | 5/1989 | Japan . |

OTHER PUBLICATIONS

English translations of German Patents, 3,915,510; 3,823, 399; 4,121,177.

"GTO Driving and Protection Technique with Status Monitoring", p. 119, FIG. 11, IEEE Transactions on Industry Applications, vol. 24, No. 1, Jan./Feb. 1099, pp. 115–120, 1988.

*Primary Examiner*—Peter S. Wong
*Assistant Examiner*—Shawn Riley
*Attorney, Agent, or Firm*—Antonelli, Terry, Stout & Kraus

[57] ABSTRACT

A power converter including a snubber circuit which is smaller and regenerates more energy than a conventional snubber circuit. A plurality of self-quenching semiconductor switching elements are connected in series across a power supply. A capacitive element is connected to the switching elements, and is charged to more than the voltage of the power supply by a snubber action due to operation of any of the switching elements. The charge stored in the capacitive element is then regenerated to the power supply. The capacitance of the capacitive element can be almost as small as a minimum required capacitance, and can be as small as one-tenth of the capacitance required in a conventional snubber circuit, thereby providing a power converter which is smaller and has a smaller snubber loss than a conventional power converter.

1 Claim, 12 Drawing Sheets

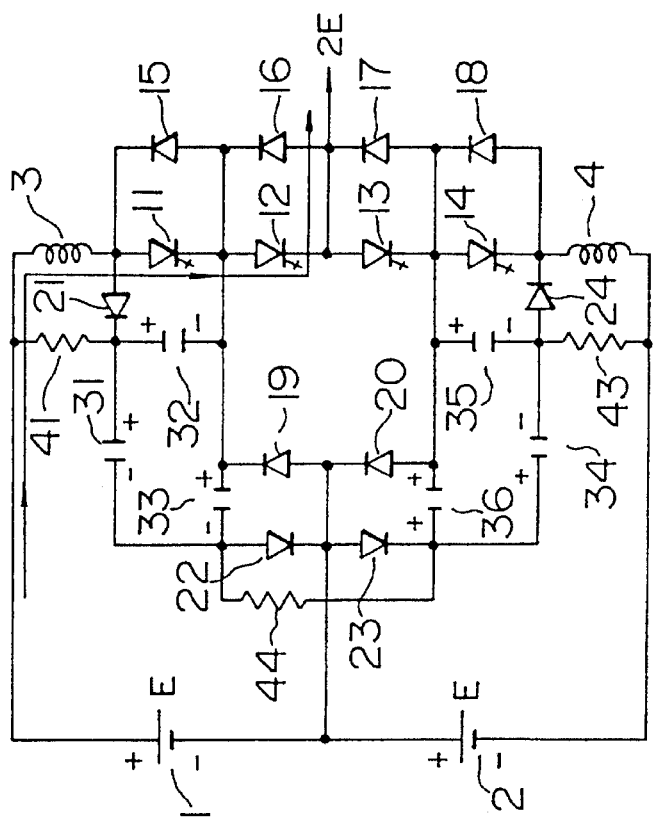

POWER CONVERTER

BACKGROUND OF THE INVENTION

1. Field of the Invention

The present invention relates to a power converter, or more in particular to an improvement of a snubber circuit.

2. Description of the Prior Art

A power converter circuit capable of regeneration of snubber energy to a power supply with the operation of a switching element is proposed in JP-A-64-89972.

The circuit according to the above-mentioned is intended for regenerating snubber energy in an asymmetric circuit configured of different snubber capacitors engaged in switching of upper and lower semiconductor switching elements.

On the other hand, an asymmetric circuit of a series multiple inverter is disclosed in JP-A-1-198280.

In the above-mentioned prior art, a capacitive element is charged to more than a source voltage to regenerate a stored charge to a power supply by a snubber action at the time of switching operation of only one of the switching elements.

The prior art poses the problem that an asymmetric configuration increases the whole size of the apparatus.

A symmetric snubber circuit is disclosed in FIG. 11 on page 119 of an article entitled "GTO Driving and Protection Technique with Status Monitoring", p., IEEE Transactions on Industry Applications, Vol. 24, No. 1, January/February 1988, pp. 115–120.

No consideration is given, however, to a decreased size of the apparatus in the prior art.

SUMMARY OF THE INVENTION

A first object of the present invention is to provide a power converter capable of reducing the snubber loss by increasing the regeneration amount.

A second object of the present invention is to decrease the size of the power converter.

The first object is achieved by a power converter comprising a plurality of self-quenching semiconductor switching elements in series, a capacitive element connected in parallel with the series of switching elements, first circuit means for charging the capacitive element to more than a source voltage by a snubber action of any of the self-quenching semiconductor switches, and second circuit means for regenerating the charge thus stored in the capacitive element to the power supply.

The second object is achieved by a power converter comprising a plurality of self-quenching semiconductor switching elements in series, a capacitive element connected in parallel with the switching elements, and circuit means for subjecting the self-quenching semiconductor switching elements to a snubber function by a common capacitive element, with the same or substantially same capacitance contributing to the snubber action for all the self-quenching semiconductor switching elements.

When a self-quenching semiconductor switching element changes from the on state to the off state, a current flows into a capacitive element connected to the switching element due to the snubber action, thereby charging the capacitive element. In the process, the capacitive element is charged to more than a source voltage, and the difference between the charge thus stored and the source voltage is regenerated to a power supply.

The regeneration operation of snubber energy is performed by the snubber action on any of the self-quenching semiconductor switches connected in series.

Also, there are provided a capacitive element performing the snubber action for a plurality of switching elements at the same time, thereby to equalize the capacitance contributing to the snubber action. Thus, capacitive elements for respective switching elements are symmetrized.

The above-mentioned symmetrization realizes a small size of the snubber circuit as mentioned more in detail later.

BRIEF DESCRIPTION OF THE DRAWINGS

FIGS. 12A and 12B show an example of the operating modes of the circuit in FIG. 5.

DESCRIPTION OF THE PREFERRED EMBODIMENT

Before explanation of an embodiment of the present invention, the operation of a conventional apparatus will be described for better understanding of the features of the present invention.

Figure 15:
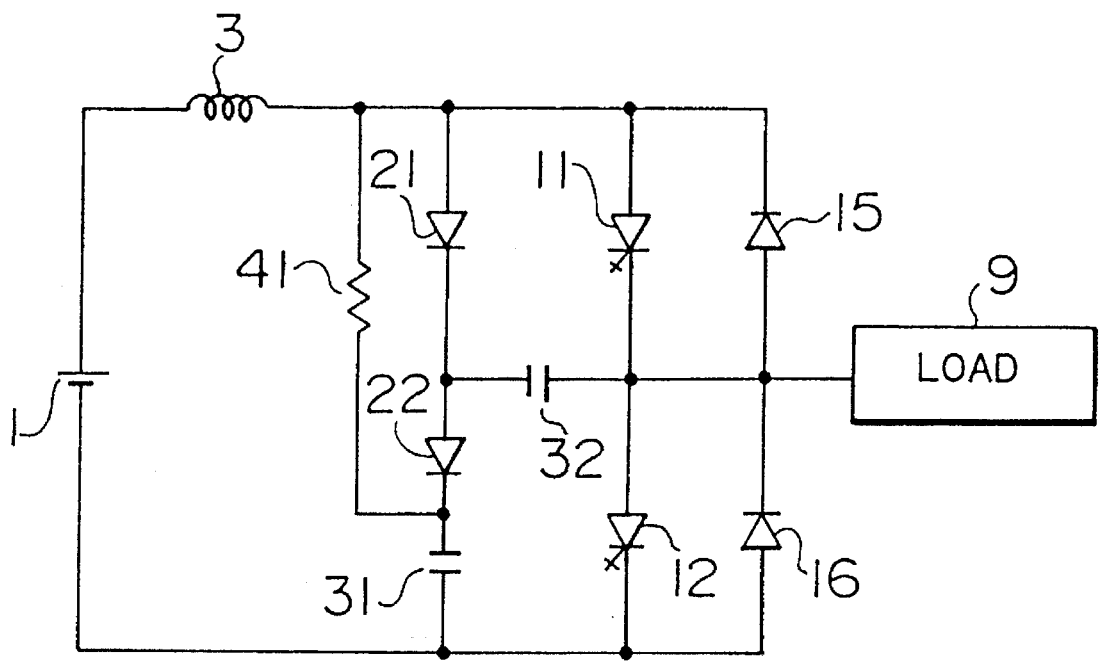
FIG. 15 is an diagram showing an asymmetric circuit in the prior art.

An asymmetric circuit capable of regeneration of snubber energy is shown in FIG. 15. When a current is flowing into a load 9 through an inductance 3 and a switching element 11 from a DC power supply 1 with the switching element 11 turned on, a snubber capacitor 31 is charged to a source voltage through the DC power supply, the inductance (wiring inductance) 3, and snubber diodes 21, 22. A snubber capacitor 32, on the other hand, discharges through the snubber diode 22, a snubber resistor 41 and the switching element 11, and the interelectrode voltage of the snubber capacitor 32 is reduced to zero by the turning on of the switching element 11. Under this condition, assume that the switching element 11 is turned off. The current that has thus far flowed in the switching element 11 flows into the snubber diode 21 and the snubber capacitor 32, thereby increasing the voltage across the snubber capacitor 32 gradually up to the source voltage but without any regenerative operation.

When the switching element 12 is turned on with a current flowing out of a load into the switching element 12, by contrast, the snubber capacitor 31 is charged up to a source voltage through the DC power supply 1, the inductance 3 and the snubber diodes 21, 22 in the same manner as when the switching element 11 is turned on. Also, the snubber capacitor 32 is charged up to the source voltage through the path formed by the DC power supply 1, the inductance 3, the snubber diode 21, the snubber capacitor 32 and the switching element 12. If the switching element 12 is turned off under this condition, the current that has thus far flowed in the switching element 12 flows into the snubber capacitor 31 through the snubber capacitor 32 and the snubber diode 22. While the voltage across the snubber capacitor 32 is decreased gradually, the snubber capacitor 31 is charged up to more than a source voltage at the same time. The charge thus stored in the snubber capacitor 31 is used for regeneration through the path including the snubber capacitor 31, the snubber resistor 41, the inductance 3 and the DC power supply 1.

As described above, a regenerative operation is possible by the snubber action of only one of the switching elements in the conventional circuit.

Figure 7:
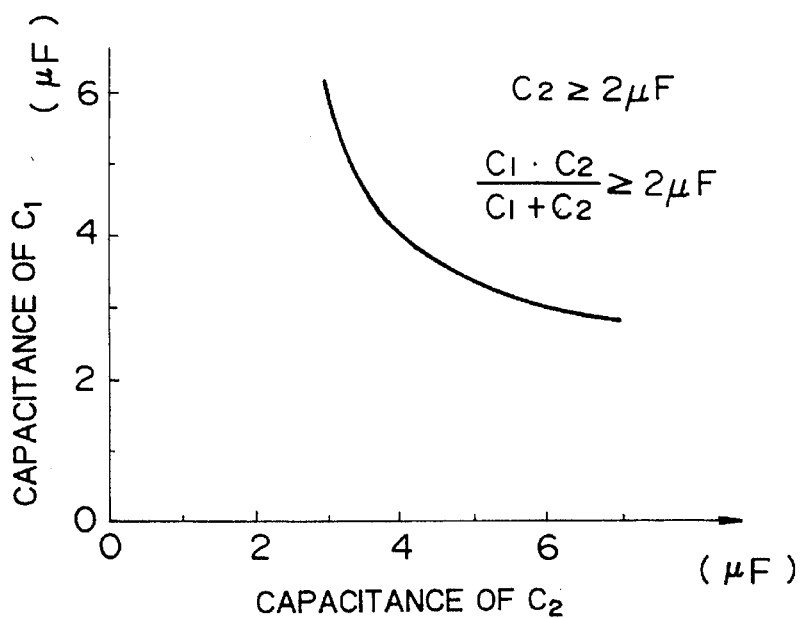
FIG. 7 is a diagram showing an example of the capacitance of the snubber capacitors for the circuit shown in the prior art.

Further, the conventional circuit comprising the switching element 11 connected in parallel with the snubber capacitor 32, and the switching element 12 connected in parallel with a series circuit including the snubber capacitors 31, 32, is asymmetric. When the capacitance of a snubber capacitor required by the current-interrupting characteristic of the switching elements 11, 12 is assumed to be 2 μF or more, the capacitance of the snubber capacitor 31 is assumed to be $C_1$, and that of the snubber capacitor 32 is assumed to be $C_2$, then the relation between the capacitances of these capacitors is given in FIG. 7.

As will be seen from the foregoing description, a capacitance 2 μF for $C_2$ requires an infinite capacitance for $C_1$. This is an inappropriate combination of snubber capacitors.

The minimum capacitance of $C_1$ and $C_2$ is selected to be $C_1=C_2=4$ μF.

Under this condition, the parallel capacitance of the switching element 11 is $C_2=4$ μF and that of the switching element 12 is $C_1C_2/(C_1+C_2)=2$ μF.

If the capacitance of the snubber capacitors is determined based on the total minimum snubber capacitance in this way, the upper and lower switching elements will operate with different snubber circuit capacitances, with the result that not only is the circuit operation different between the upper and lower switching elements, but also the snubber circuit capacitance for the switching element 11 is 4 μF instead of the required capacitance of 2 μF, thereby increasing the loss in the snubber resistor 41.

In practical applications, the capacitance is determined such that $C_1>C_2$. For example, capacitors of about 2.1 μF and 42 μF are used as $C_2$ and $C_1$) respectively.

The above-mentioned circuit according to the prior art has the disadvantage that a practical circuit cannot be configured without using a capacitor of more than a required capacitance. As a result, the problem is that a conventional circuit using a capacitor of more than a required capacitance for a power converter limited in size for use with a tram car cannot be mounted on the undercarriage thereof.

An embodiment of the present invention obviating the above-mentioned problem of the conventional circuit will be explained below with reference to the accompanying drawings.

Figure 1A:
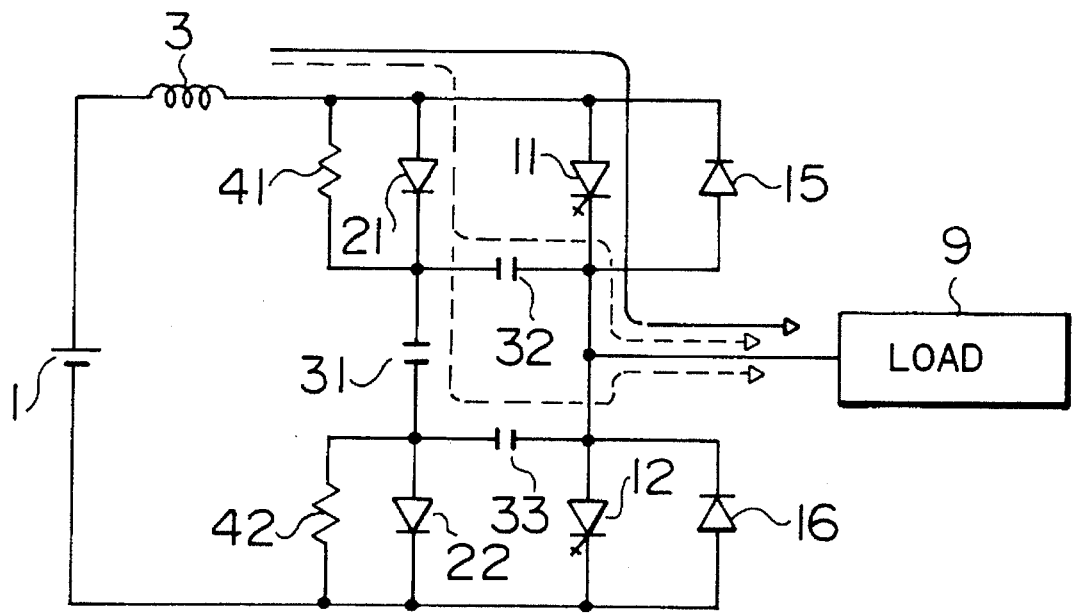
FIGS. 1A to 1C are diagrams showing a first embodiment of the present invention.
Figure 1B:
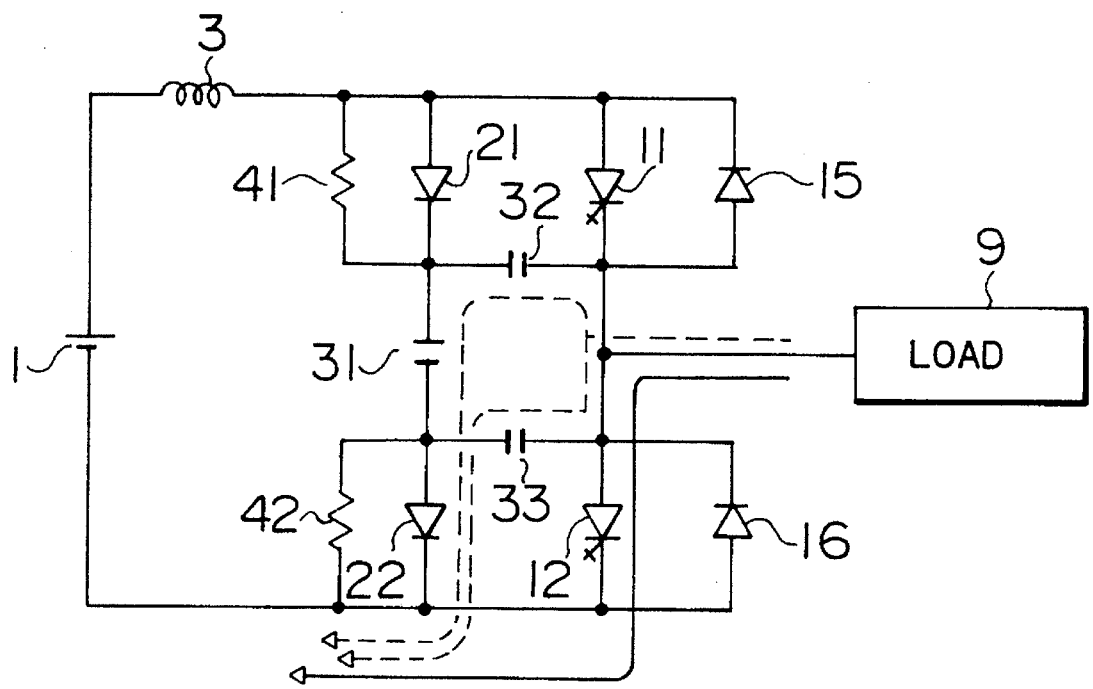
Figure 1C:
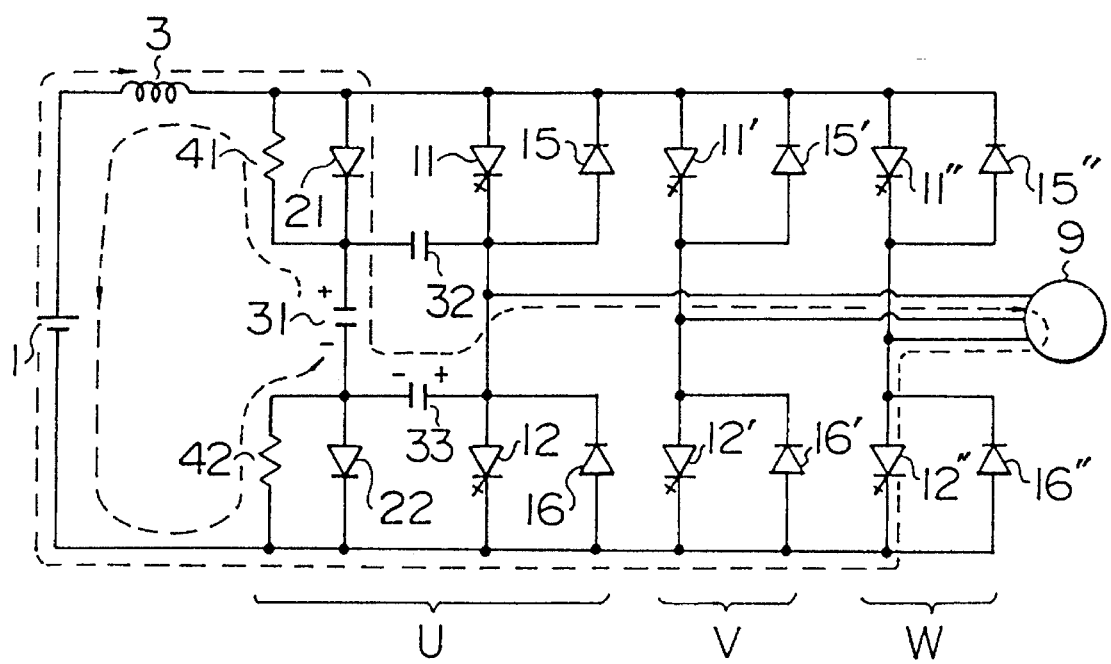

An embodiment of the present invention is shown in FIGS. 1A to 1C. A power converter circuit configured of a single-phase bridge inverter with semiconductor switching elements is shown.

Self-quenching semiconductor switching elements such as GTO's, transistors, IGBT's or the like (hereinafter sometimes referred to merely as "the switching elements") designated by numerals 11, 12 are connected in series. The junction point of the switching elements serves as a load output terminal and is connected to a load 9. The series circuit of the switching elements 11, 12 is connected in parallel with another series circuit including a snubber diode 21, a snubber capacitor 31 and a snubber diode 22. Snubber capacitors 32 and 33 are inserted between the junction point of the switching elements 11 and 12 on the one hand and the cathode of the snubber diode 21 and that of the anode of the snubber diode 22 on the other hand, respectively. The snubber diodes 21 and 22 are connected in parallel with snubber resistors 41 and 42 respectively. The switching elements 11 and 12 are also connected in parallel with freewheeling diodes 15 and 16, respectively.

Now, the operation of this circuit will be described.

Assume that the switching element 11 is turned on, and a current designated by the solid arrow in FIG. 1A flows in the load 9 from the DC power supply 1 through the inductance 3 and the switching element 11. In the process, the snubber capacitor 31 is charged up to the source voltage through the path formed by the DC power supply 1, the inductance 3, the snubber diode 21, the snubber capacitor 31 and the snubber diode 22. The snubber capacitor 32, on the other hand, discharges through the path including the snubber resistor 41 and the switching element 11 due to the turning on of the switching element 11, and the interelectrode voltage of the snubber capacitor 32 is reduced to zero.

Also, the snubber capacitor 33 is charged up to the source voltage through the path formed by the DC power supply 1, the inductance 3, the switching element 11, the snubber capacitor 33 and the snubber diode 22 in similar fashion. When the switching element 11 is turned off under this condition, the current that has thus far flown in the switching element 11 flows into a parallel circuit formed by the snubber capacitor 32 and the snubber capacitors 31, 33 through the snubber diode 21 as shown by the dashed arrows in FIG. 1A. As a result, the voltage across the snubber capacitor 32 is gradually increased, and the voltage across the snubber capacitor 33 is reduced, thereby reducing the potential at the junction point between the switching elements 11 and 12 (the load output terminal). At the same time, the capacitor 33 releases the charge stored therein while charging the capacitor 31 to more than the source voltage. With the subsequent decrease of the potential at the load output point to a level substantially equivalent to the minus terminal of the DC power supply 1, the diode 16 turns on, followed by current freewheeling to the load 9. At this time, the switching element 11 is connected to a capacitance resulting from a parallel circuit including the snubber capacitor 32 on the one hand and the snubber capacitors 31, 33 in series on the other hand. As shown in FIG. 1B, by contrast, assume that the switching element 12 is in the on state, a current flows out of a load as shown by solid arrow, and that a current is flowing in the switching element 12. The snubber capacitor 31 is charged up to the source voltage, as in the above-mentioned case where the switching element 11 is turned on, through the path formed by the DC power supply 1, the inductance 3, the snubber diode 21, the snubber capacitor 31 and the snubber diode 22. The snubber capacitor 32 is also charged up to the source voltage through the path formed by the DC power supply 1, the inductance 3,.the ,snubber diode 21, the snubber capacitor 32 and the switching element 12, while the snubber capacitor 33 is discharged to zero through the switching element 12 and the snubber resistor 42 due to the turning on of the switching element 12. On the assumption that the switching element 12 is turned off under this condition, the current that has thus far flown in the switching element 12 flows a parallel circuit including the snubber capacitor 33 on the one hand and the snubber capacitors 32, 31 in series on the other hand as shown by the dashed arrows in FIG. 1B, and through the snubber diode 22, increases the voltage across the snubber capacitor 33 steadily and reduces the voltage across the snubber capacitor 32, thereby increasing the potential at the junction point of the switching elements 11 and 12 (the load output terminal). In the process, the capacitor 32 releases the charge stored therein while at the same time charging the capacitor 31 to more than the source voltage. With the subsequent increase in the potential at the load output point up to a point substantially equivalent to the plus terminal of the DC power supply, the diode 15 turns on, followed by current freewheeling from the load 9. At this time point, the switching element 12 is connected to a capacitor resulting from a parallel circuit including the snubber capacitor 33 on the one hand and the snubber capacitors 32, 31 in series on the other hand.

The above-mentioned operation causes alternate energization of the switching elements 11 and 12.

The principle on which the snubber loss is reduced is shown in FIG. 1C. An induction motor providing a load 9 is driven by a three-phase inverter.

Assume that the switching elements 11 and 12" are on. The capacitor 33 is stored with the charge in the shown direction due to the snubber operation with the switching element 12 turned off. Although the snubber circuit of only the U phase is shown, both the V and W phases have similar snubber circuits.

Now, assume that the switching element 11 is turned off under this condition. The current begins to flow as described above. Only a part of the operation will be explained below.

The energy stored in the inductance 3 is released as a current. This current is returned to the inductance 3 through the snubber diode 21, the snubber capacitor 31, the snubber capacitor 33, the load 9, the W-phase switching element 12" and the power supply 1. The voltage across the snubber capacitor 31 is boosted to more than the source voltage by this current, while supplying the charge of the snubber capacitor 33 charged by the previous snubber action to the load 9. The snubber capacitor 33 releases its charge until exhausted.

Upon exhaustion of the current supplied by the inductance 3, the snubber capacitor 31 regenerates the charge corresponding to the voltage increase beyond the source voltage to the power supply through the snubber resistors 41, 42.

These operations reduce the snubber loss effectively.

In the above-mentioned prior art circuit shown in FIG. 11 on page 119 of the IEEE reference, diodes are connected between snubber capacitors connected in a delta configuration. This makes it difficult to reduce the size of this prior-art circuit for the reasons discussed below. Also, this prior-art circuit is difficult to install on the undercarriage of a railway coach, thereby limiting the possible arrangements of other undercarriage equipment.

In contrast, in the embodiment of the present invention shown in FIG. 1C, no diodes or other devices are connected between any of the snubber capacitors 31, 32, and 33 which are connected in a delta configuration. This reduces the inductance due to wiring between the snubber capacitors 31, 32, and 33.

In the prior-art circuit, the connection of the diodes between the snubber capacitors connected in a delta configuration increases the length of wiring between the snubber capacitors, thereby increasing the inductance of the wiring, and also causes a forward voltage drop to occur in the diodes. The result is an undesirable increase in the spike voltage caused specifically by a self-quenching element. In order to absorb this voltage, therefore, the capacitance of the snubber capacitors is required to be increased.

Also, the diodes required in the prior-art circuit result in an increased number of required parts.

The above-mentioned prior-art circuit thus lacks consideration of size reduction.

In FIGS. 1A to 1C, the series circuit including the snubber diode 21, the snubber capacitor 31 and the snubber diode 22 connected in parallel to a series circuit of switching elements has a clamp function.

Specifically, the electromagnetic energy stored in the inductance 3 (including the stray inductance existing in the circuit between the clamp circuit and the power supply) is absorbed. As a result, the electromagnetic energy generated at the time of switching is not applied to the switching elements 11, 12, thereby making it possible to reduce the design withstanding voltage of the switching elements.

Let the capacitance of the snubber capacitor 31 be $C_1$ and the capacitances of the snubber capacitors 31, 32 be $C_2$ and equal to each other in FIGS. 1A to 1C. The snubber capacitance parallel to the switching element 11 is given as $C_2+C_1C_2/(C_1+C_2)$ and that parallel to the switching element 12 also as an equal $C_2+C_1C_2/(C_1+C_2)$.

Specific values will be substituted into these equations to study the capacitance of a snubber circuit according to the present invention.

Figure 8:
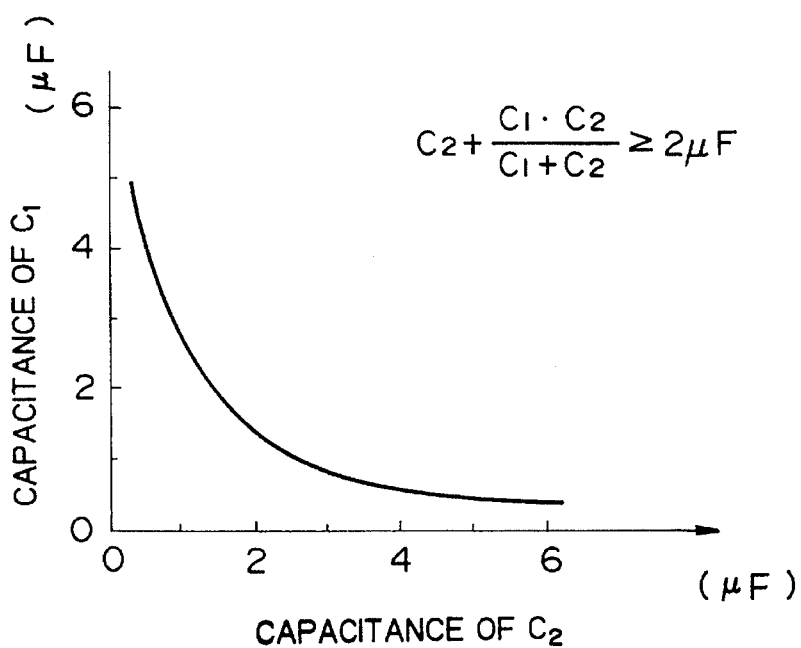
FIG. 8 shows an example of the capacitance of the snubber capacitors according to the present invention.

Assuming that the snubber capacitances of the switching elements 11 and 12 is more than 2 µF as in the case of the prior art mentioned above, the relationship between $C_1$ and $C_2$ is as shown in FIG. 8.

Unlike in the conventional snubber circuit, the snubber capacitance by any combination of $C_1$ and $C_2$ against the switching elements 11 and 12 remains equal.

The whole snubber capacitance becomes minimum when $C_1=C_2$, and both $C_1$ and $C_2$ are 4/3µF. In this case, the whole snubber capacitance is calculated to be 4 µF, and comparison with the above-mentioned conventional circuit shows that the capacitance is less than 1/20.

As will be seen from above, according to the present embodiment, the snubber capacitor of the whole snubber circuit is remarkably reduced as compared with the conventional snubber circuit, thus making it possible to reduce the circuit size.

Under this condition, the capacitance contributing to the snubber action for the upper and lower arms is equal, and therefore the value $C_1$ may meet the relation $C_1>C_2$, taking the clamp function and the like into consideration.

The charge stored in the capacitor 31 to more than the source voltage with the switching elements 11 and 12 turned off is regenerated to the power supply 1 through the snubber resistor 42, the snubber capacitor 31 and the snubber resistor 41.

Although a resistor is used as discharge means for energy regeneration according to this embodiment, the present invention is not confined to such a resistor to the extent that the charge stored in a capacitor can be discharged. A circuit of simple wirings, for example, may regenerate the charge stored by snubber action to a power supply.

In actual circuits, however, resonance would be caused by the inductance in the snubber capacitor and the circuit. No power supply is available as yet for absorbing this resonance effectively, and therefore a resistor is used as discharge means. The resistor making up such discharge means is connected in the circuit for the purpose of absorbing the resonance as mentioned above. In the circuit of FIG. 1, therefore, the optimum resistance value is determined from the values of the capacitor 31 and the inductance 3.

Figure 9:
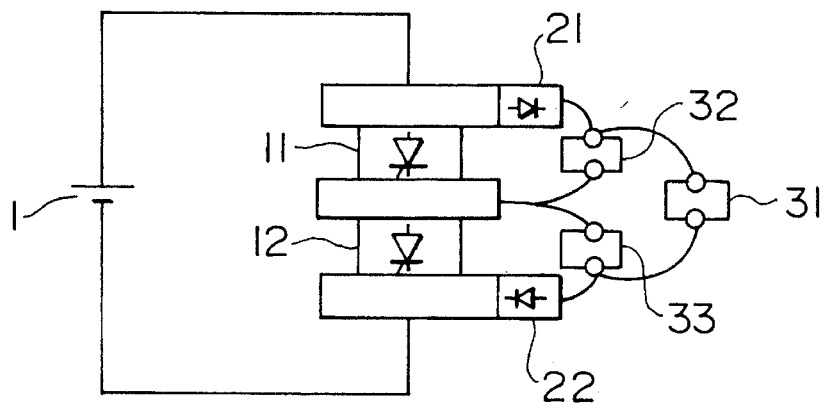
FIG. 9 shows an example of a packaging diagram according to the present invention.

Other embodiments described later also include a resistor as discharge means in similar manner. An example packaged with the circuit in FIGS. 1A to 1C is shown in FIG. 9.

Snubber diodes 21, 22, a snubber capacitor 31 and a snubber capacitor 33 are connected in parallel as a snubber circuit for the switching element 11.

As a snubber circuit for the switching element 12, on the other hand, a snubber capacitor 33, a snubber diode 22 and snubber capacitors 32, 31 are connected in parallel.

In this way, wiring inductances can be arranged to the same degree for the switching elements 11 and 12. On the other hand, the snubber diode 21, the snubber capacitor 32, the switching element 11, the snubber capacitor 33 and the snubber diode 22 to the switching element 12 can be connected as a snubber circuit in a minimum loop, thereby easily reducing the wiring inductance.

Figure 2A:
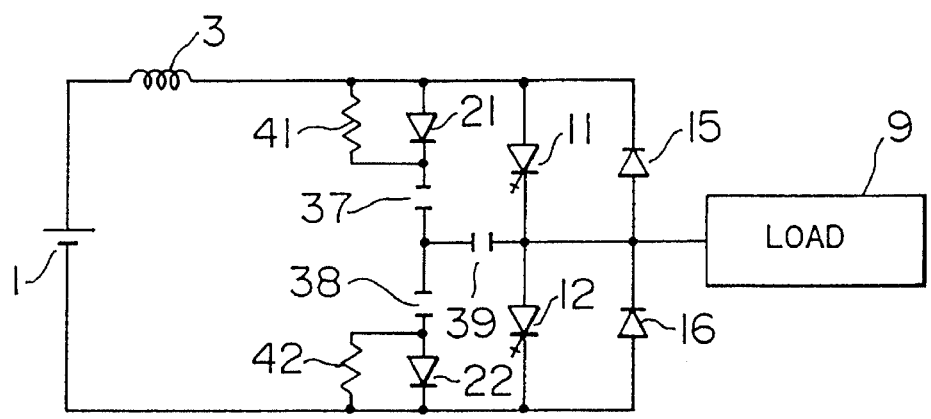
FIGS. 2A and 2B are diagrams showing a second embodiment.
Figure 2B:
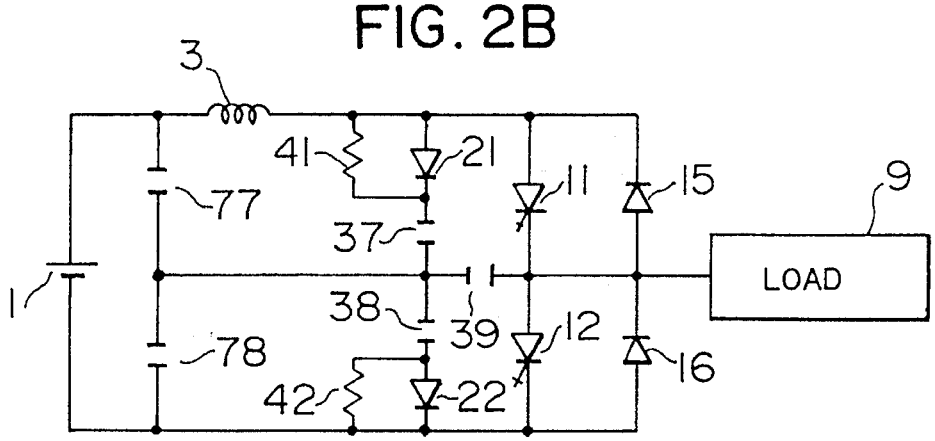
Figure 3:
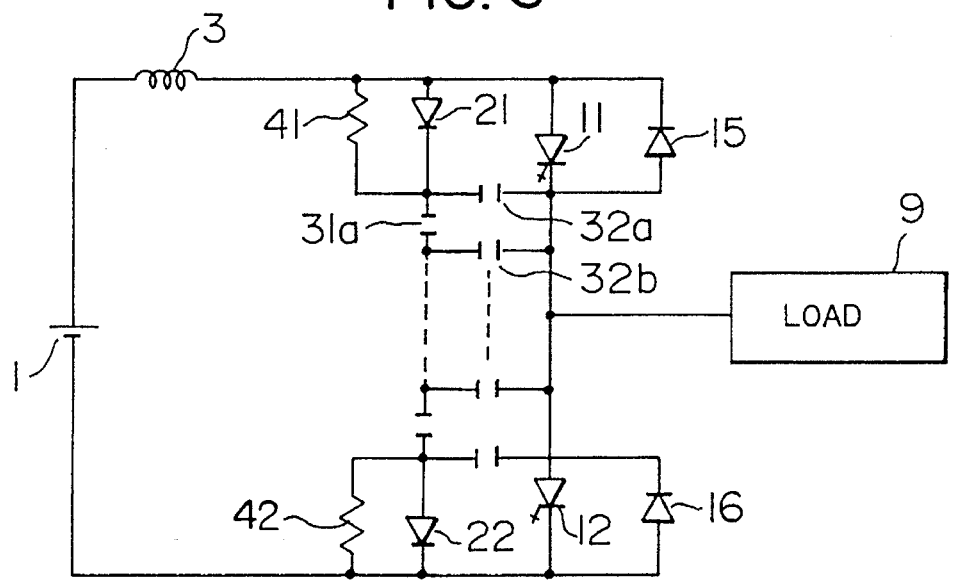
FIG. 3 shows a third embodiment of the present invention.

FIGS. 2A and 2B and 3 show second and third embodiments of a converter making up a single-phase bridge inverter.

FIG. 2A is a diagram showing delta-star conversion taking into consideration the fact that the snubber capacitors 31, 32 and 33 are configured in delta in FIG. 1.

In the case under consideration, two capacitors are formed in series. The withstanding voltage of the capacitors can thus be reduced to one half as compared with the circuit in FIGS. 1A to 1C.

FIG. 2B is such that the potential at the junction point of the capacitors 37 and 38 is stabilized to a level equal to one half of the voltage of the power supply 1. Voltage-dividing capacitors 77, 78 are connected in parallel to the power supply 1, with the neutral point being connected to the junction point of the capacitors 37, 38. This stabilizes the voltage.

An embodiment with a plurality of delta capacitor circuits formed in series is shown in FIG. 3. The same object is achieved by this circuit although the capacitor circuit is complicated. As in FIG. 2B, the circuit is stabilized by connecting the junction points of the capacitors 31a, 31b and so on with as many junction points of the voltage-dividing capacitors respectively.

Figure 4:
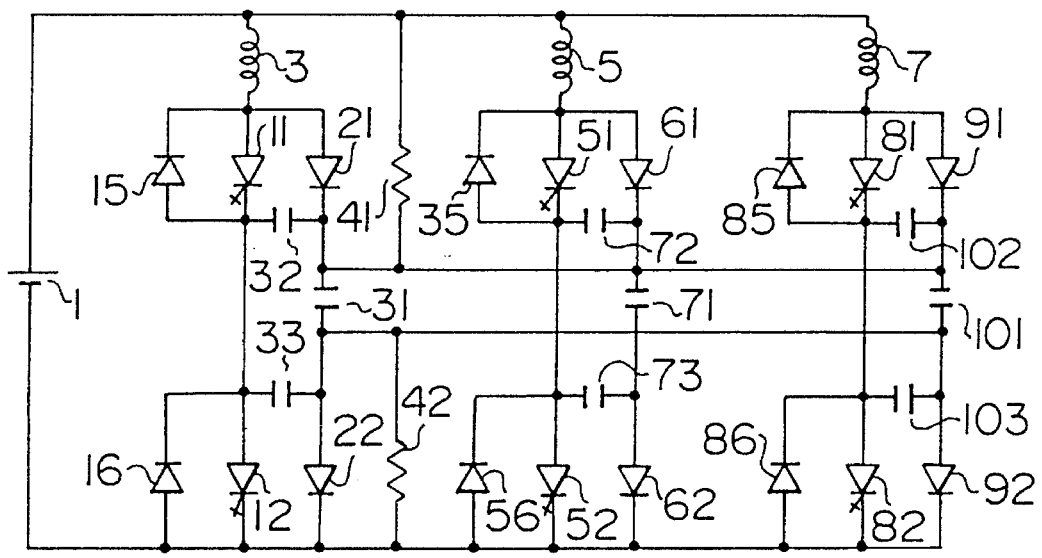
FIG. 4 shows an example of a three-phase configuration of the first embodiment.

FIG. 4 shows an example of a power converter constituting a three-phase circuit according to the embodiment shown in FIGS. 1A to 1C.

A three-phase inverter includes a DC power supply 1 from which current is supplied through inductances 3, 5, 7, and a series circuit of switching elements 11, 12 and 51, 52, 81, 82. This three-phase inverter is connected with a series circuit of a snubber diode 21, a snubber capacitor 31 and a snubber diode 22, a series circuit of a snubber diode 61, a snubber capacitor 71 and a snubber diode 62, a series circuit of a snubber diode 91, a snubber capacitor 101 and a snubber diode 92, and snubber capacitors 32, 33, 72, 73, 102, 103 inserted between the ends of the snubber capacitors 31, 71, 101 and an output point respectively.

The snubber capacitors 31, 71 and 101 which are always charged to the source voltage can be connected in parallel. As a result of this configuration, snubber resistors are so unified that the snubber resistors 41 and 42 are inserted between the plus terminals of the snubber capacitors 31, 71, 101 and the plus terminal of the DC power supply, and between the minus terminals of the snubber capacitors 31, 71, 101 and the minus terminal of the DC power supply, respectively. By reducing the mutual inductance of the snubber capacitors 31, 71, 101, the three phases may be unified.

Figure 5:
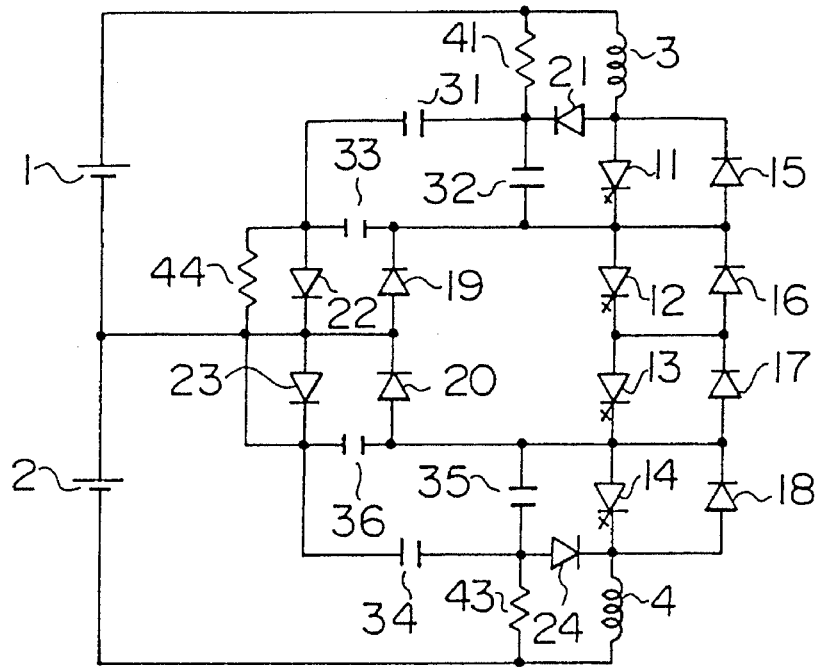
FIG. 5 shows an example of a series multiple configuration of the first embodiment.

FIG. 5 shows a power converter circuit configured of a series multiple inverter with semiconductor switching elements.

A plus terminal, a minus terminal and a neutral terminal are extended from DC power supplies 1, 2, and are connected with switching elements 11 to 14 in series. The junction point of the switching elements 11, 12 and the junction point of switching elements 13, 14 are connected to the neutral terminal through clamp diodes 19, 20, respectively.

This circuit has the circuit according to the embodiment shown in FIGS. 1A to 1C connected between the switching element 11 and the clamp diode 19 and also between the clamp diode 20 and the switching element 14. More specifically, the switching element 11 and the clamp diode 19 are connected in parallel to a series circuit including the snubber diode 21, the snubber capacitor 31 and the snubber diode 22. The snubber capacitors 32, 33 are connected between the ends of the snubber capacitor 31 and the junction point of the switching element 11 and the clamp diode 19. Upper and lower snubber circuits in symmetric relation with each other are connected between the clamp diode 20 and the switching element 14. In a series multiple inverter circuit, the switching element 11, the clamp diode 19, the clamp diode 20 and the switching element 14 are operated alternately, and therefore the embodiment shown in FIGS. 1A to 1C is applicable.

Figure 10:
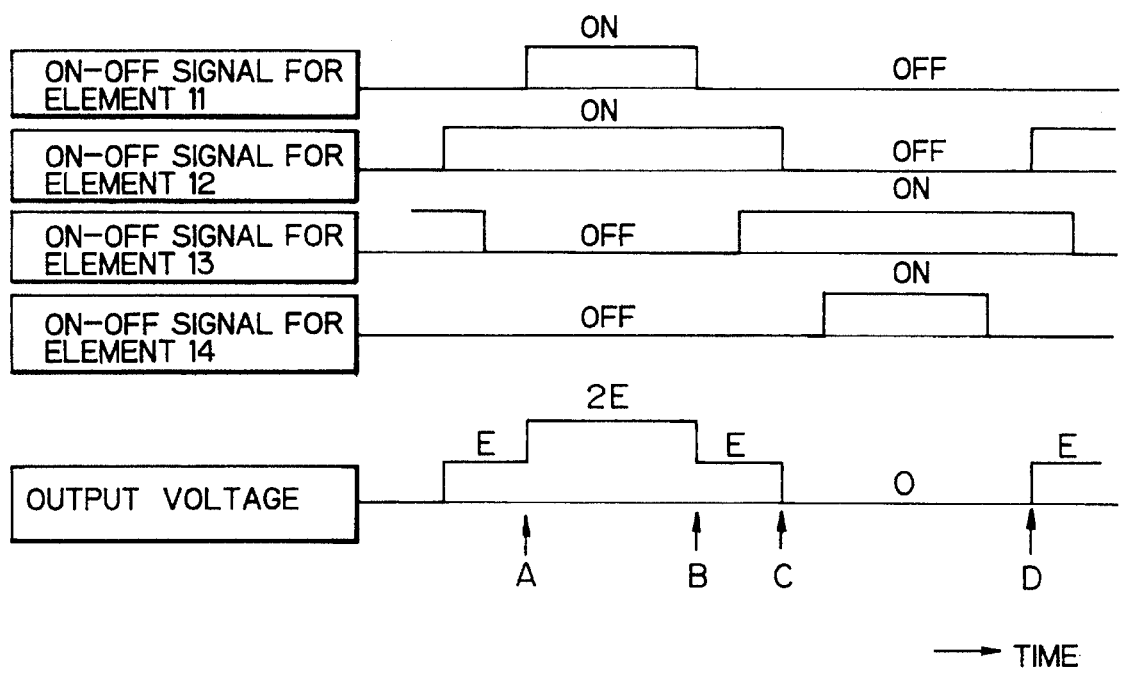
FIG. 10 is a diagram showing the relation between the operation and an output voltage of the switching element in FIG. 5.

An example of the operating mode of the embodiment in FIG. 5 is shown in FIG. 10, and shows the relationship between the operation and output voltage of the switching elements 12, 13 and 14. The voltages across the DC power supplies 1 and 2 shown in FIG. 10 are both assumed to be E.

First, the switching elements 1 and 2 are both turned on, with the switching elements 11, 14 turned off. The neutral potential E is selected as an output voltage.

Then, in order to select an output voltage E, the switching elements 11, 12 are turned on, and the switching elements 13, 14 turned off. In order to prevent the short-circuiting of the DC current 1, the switching element 11 is turned on only after turning off the switching element 113.

As the next step, the switching element 11 is turned off whereby the output voltage E is selected again. The switching elements 11 and 12 are both turned off, and the elements 13 and 14 turned on thereby to select zero as an output voltage.

In this way, the series multiple inverter is such that the output voltage is variable from zero to E to 2E to E to zero.

The function of the circuit shown in FIG. 5 with each output voltage variable in A, B, C and D modes will be explained.

Figure 11B:
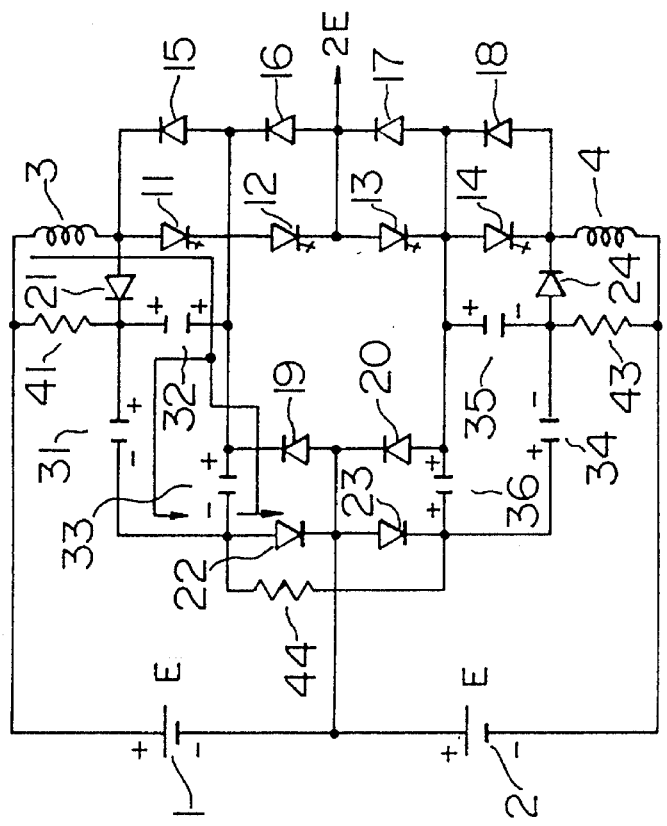
FIGS. 11A and 11B show an example of the operating modes of the circuit in FIG. 5.
Figure 11A:
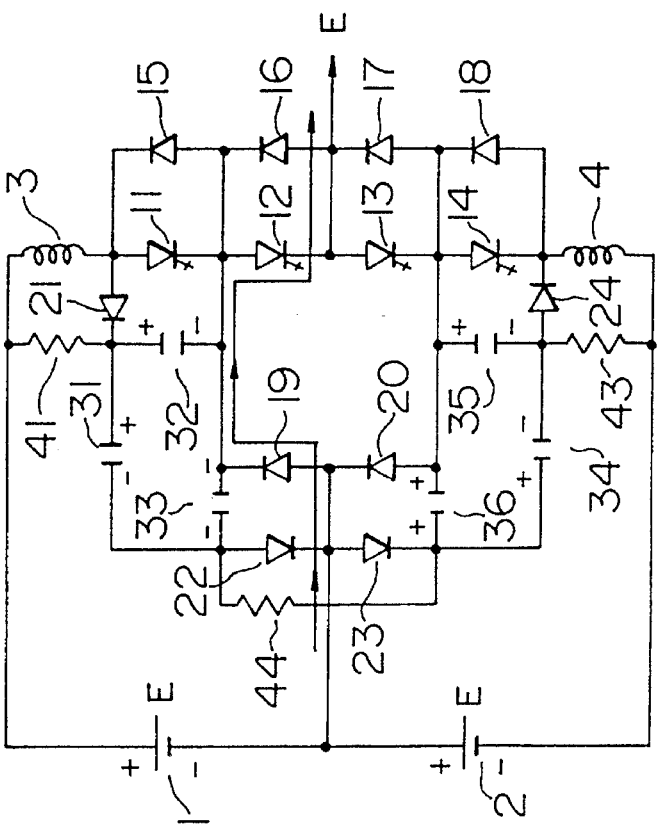

FIGS. 11A and 11B show the modes in which the output voltage changes from E to 2E.

With the turning on of the switching elements 12, 13, a current is supplied to a load through the clamp diode 19 and the switching element 12 from the neutral point of the DC power supplies 1, 2 as shown.

In the process, since the switching element 11 is turned off, the potential at the snubber capacitors 31, 32, 33 is such that the capacitors 32 is charged to the source voltage E, and the snubber capacitor 31 to the source voltage E by the circuit including the inductance 3, the snubber diode 21, the snubber capacitor 31 and the snubber diode 22. The charge is released from the snubber capacitor 33 because the minus sides of the snubber capacitors 31, 33 are both connected to the neutral point.

The operation of the snubber circuit in a mode where the output voltage becomes 2E with the switching element 11 turned on from the above-mentioned condition will be described.

With the turning on of the switching element 11, the above-mentioned current that has thus far flowed in the clamp diode 19 is offset by the current flowing through the DC power supply 1, the inductance 3, the switching element 11 and the clamp diode 19. After that, the clamp diode 19 restores the voltage-blocking ability and charges the snubber capacitor 33 as shown.

The charge in the snubber capacitor 32, on the other hand, is released partly to zero through the snubber resistor 41, the inductance 3 and the switching element 11, and partly through the snubber capacitor 32, the snubber capacitor 31, the snubber diode 22, the clamp diode 19 and the snubber capacitor 32 on the other hand. The energy of the snubber capacitor 32 is thus transferred to the snubber capacitor 31.

Part of the energy of the snubber capacitor 32 that has been transferred to the snubber capacitor 31 is regenerated to the DC power supply 1 through a closed loop including the snubber capacitor 31, the snubber resistor 41, the DC power supply 1, the snubber diode 23 and the snubber resistor 44.

After that, the switching element 13 is turned off, so that current is supplied from the DC power supply 1 to a load through the inductance 3 and the switching elements 11, 12.

A mode in which the output voltage changes from 2E to E is shown in FIGS. 12A and 12B.

Since the switching elements 11, 12 are turned on, the main current is supplied from the DC power supply 1 through the inductance 3 and the switching elements 11 and 12 to a load as shown.

The snubber capacitors 31, 32, 33 are such that the snubber capacitor 32 is discharged to zero potential by the turning on of the switching element 11, the snubber capacitor 31 is charged to the source voltage E as mentioned above, and the snubber capacitor 33 is charged also to the source voltage E with the turning off of the clamp diode 19.

When the switching element 11 turns off from this state, the current that has thus far flowed therein flows through the snubber diode 21 to the snubber capacitor 32 on the one hand and through the snubber capacitor 31 to the snubber capacitor 33 on the other hand. The charge stored in the snubber capacitor 33 is applied through a bypass to the load and discharged to zero.

After that, a current is supplied to the load through the clamp diode 19 and the switching element 12.

The charge stored in the snubber capacitor 33, on the other hand, is discharged through a bypass to a load, while at the same time charging the snubber capacitor 31 to more than the source voltage E. Then, the current is regenerated to the power supply 1 by a regenerative closed circuit in the same manner as mentioned above.

Figure 13A:
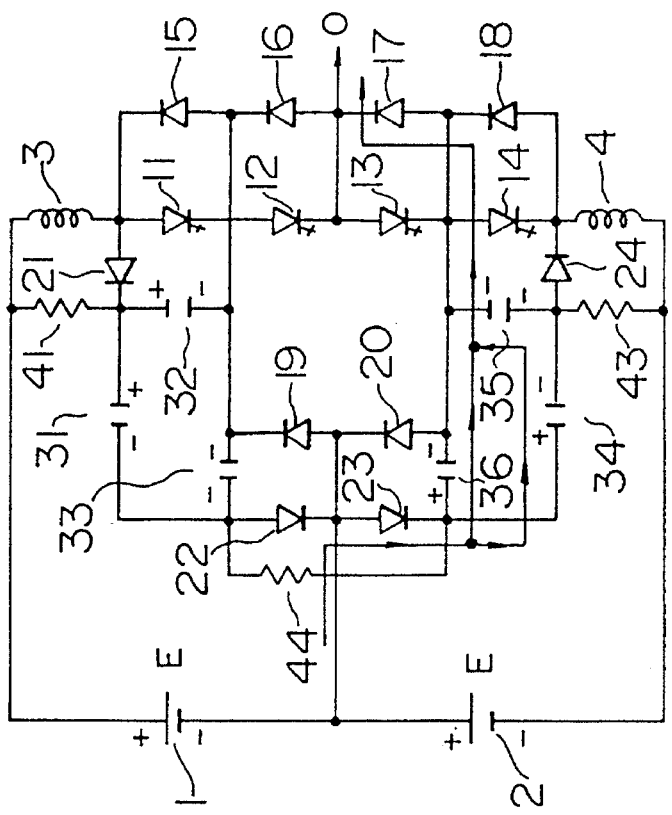
FIGS. 13A and 13B show an example of the operating modes of the circuit in FIG. 5.
Figure 13B:
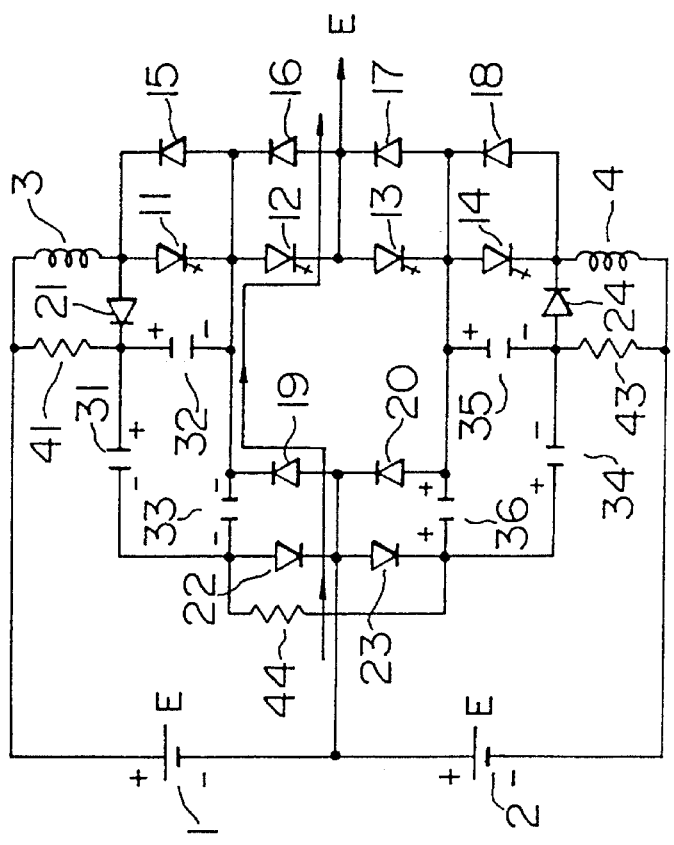
Figure 14A:
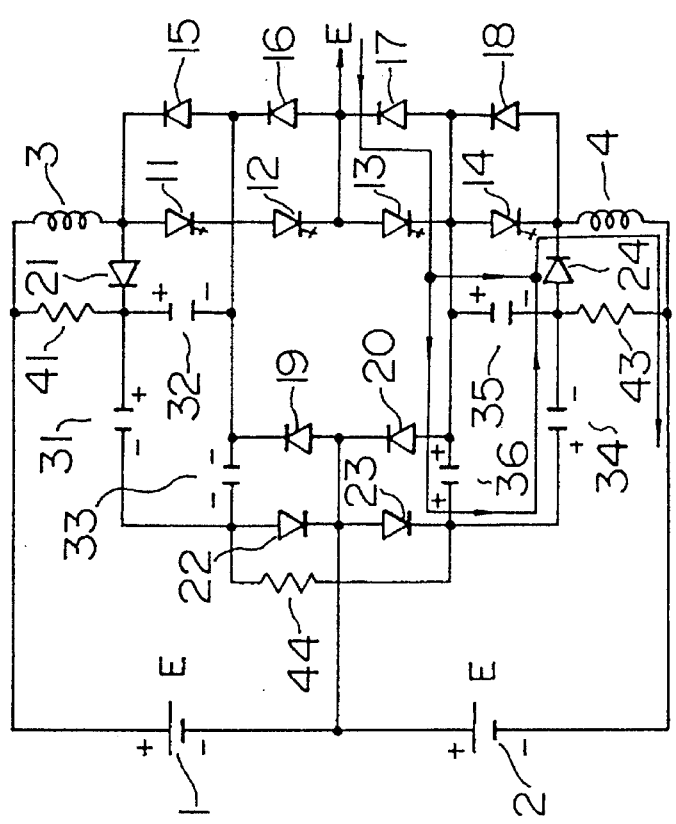
FIGS. 14A and 14B show an example of the operating modes of the circuit in FIG. 5.
Figure 14B:
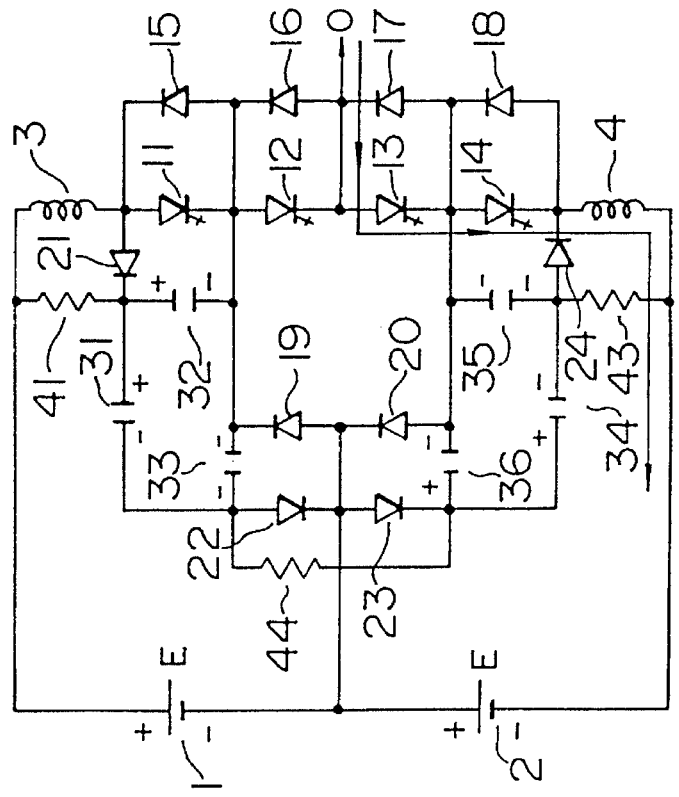

FIGS. 13A and 13B show modes in which the output voltage changes from E to zero.

In view of the fact that the switching element 12, 13 are turned on, the turning off of the switching element 12 from the same state as when E is selected in FIGS. 11A and 11B causes the snubber circuit to operate in the manner described below in a mode where the output voltage changes from E to zero.

With the turning off of the switching element 12, the current that has thus far flowed therein is supplied through a bypass including the snubber diode 23, the snubber capacitor 36 and the freewheel diode 17 on the one hand and to the snubber capacitor 34 and the snubber capacitor 35 on the other hand.

Since the switching element 14 is turned off, the snubber capacitor 35 that has been charged up to the source voltage E is discharged to zero through a bypass to a load.

Subsequently, the load current freewheels through the freewheel diodes 18, 17.

The charge stored in the snubber capacitor 35, on the other hand, is discharged through a bypass to a load, while at the same time charging the snubber capacitor 34 to more than the source voltage E (during the period when the snubber function is working), after which the charge stored in the snubber capacitor 34 is regenerated to the power supply 2 by a closed circuit including the snubber capacitor 34, the snubber resistor 44, the snubber diode 22, the power supply 2 and the snubber resistor 43.

FIG. 15 shows a mode in which the output voltage is changed from zero to E.

Since the switching elements 13, 14 are turned on, the current flows in from a load through the route shown.

In the process, the snubber capacitors 34, 35, 36 operate in such a manner that the snubber capacitor 35 is discharged to zero, the snubber diode 34 is charged up to the source voltage E through the snubber diode 23, the snubber capacitor 34, the snubber diode 24 and the inductance 4, and the snubber capacitor 36 is charged also up to the source voltage E since the clamp diode 20 is turned off.

After the switching element 14 is turned off from the above-mentioned state, the snubber circuit operates as mentioned below in a mode for turning on the switching element 12.

The turning off of the switching element 14 causes the main circuit current that has thus far flown to be divided into a parallel circuit including a series circuit of the snubber capacitors 36, 34 and the snubber capacitor 35, and further flows into the DC power supply 2 through the snubber diode 24.

At the same time, the charge in the snubber capacitor 36 is transferred to the snubber capacitor 34, thereby reducing the charge thereof to zero. The snubber capacitor 34 is also charged up to the source voltage E.

The switching element 12 is then turned on, and the main circuit current flows to the power supply 1 through the route including the switching element 13 and the clamp diode 20.

The charge stored in the snubber capacitor 34 to more than the source voltage, on the other hand, is regenerated to the source voltage 2 by a closed circuit including the snubber resistor 44, the snubber diode 22, the power supply 2, the snubber resistor 43 and the snubber capacitor 34.

As explained above, according to the present embodiment, the same effect is obtained as in the power converter constituted by a single-phase bridge inverter. Also, the snubber capacitance is minimized obviously by equalizing the capacitances of the snubber capacitors 31, 33, 34, 35 and 36.

Figure 6:
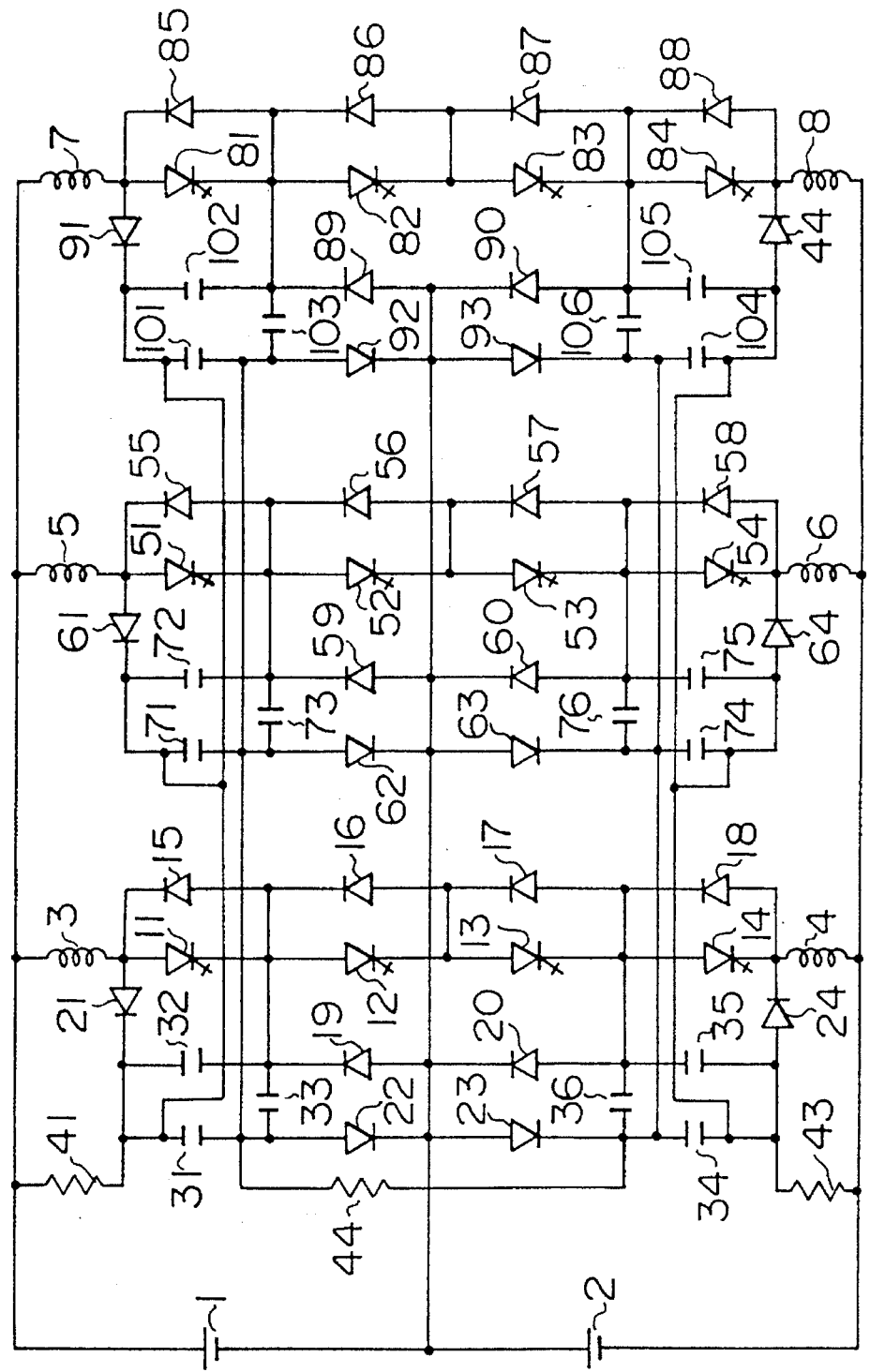
FIG. 6 shows an example of a three-phase series multiple configuration according to the first embodiment.

FIG. 6 shows an example of power converter with the circuit according to the embodiment shown in FIG. 5 constructed in three phases. As shown in FIG. 4, the snubber capacitors 31, 71, 101 may be connected in parallel to the snubber capacitors 34, 74, 104. In that case, the snubber resistor 41 is inserted between the plus terminal of the snubber capacitors 31, 71, 101 and the plus terminal of the DC power supply, the snubber resistor 44 between the minus terminal of the snubber capacitors 31, 71, 101 and the plus terminal of the snubber capacitors 34, 71, 101, and the snubber resistor 43 between the minus terminal of the snubber capacitors 34, 71, 101 and the minus terminal of the DC power supply.

By reducing the mutual inductance of the snubber capacitors 31, 71, 101 and 34, 71, 101, the three phases thereof may be unified respectively.

Embodiments of the present invention shown in FIGS. 2A and 2B and 3 are also applicable to a three-phase inverter as well as to a series multiple circuit as described above. Especially, in applying the embodiment of FIGS. 2A and 2B to a three-phase inverter, a series circuit of the snubber capacitors 34, 35 may be unified in parallel for each phase. Also, the junction points of the snubber capacitors 34, 35 are unifiable for three phases.

In the embodiment shown in FIG. 3, the terminal points of the snubber capacitors 31a, 31b, 31c can of course be unified for three phases.

The plus terminal of the snubber resistor 41, which is connected to the minus side of the inductance 3 in FIGS. 1A to 1C, may alternatively be connected to the plus side of the inductance 3.

In similar fashion, the snubber resistors 41, 43 in FIG. 5, which are connected to the plus terminal of the inductance 3 and the minus terminal of the inductance 4 respectively, may alternatively be connected to the minus side of the inductance 3 and the plus side of the inductance 4, respectively.

Also in the embodiments shown in FIGS. 2A and 2B and 3, the plus terminal of the snubber resistor 41 may be connected to the plus side of the inductance 3 as an alternative.

Further, the inductances 3 to 8, which function to suppress the current at the time of switching on, may not necessarily be provided as specific component elements, but the stray inductance existing in the circuit serves the same purpose.

Although explanation is made above about embodiments comprising a power converter including an inverter as a switching element, a similar effect is of course obtained with a power converter including a chopper circuit.

The present invention is applicable not only to the control system for the electric railway coaches using an inverter as explained above but also to any systems requiring a low loss and a small size including electric automobiles and rolling mills.

According to the present invention, the snubber action of a switching element in switching operation permits the charge stored in a capacitive element to be regenerated to a power supply, thereby effectively reducing the snubber loss.

Further, a capacitive element having the snubber function may be used as a switching element at the same time, with the connections similarly configured. As a result, a power converter is constructed with capacitive elements with only the required capacitance, thereby reducing the size of the power converter.

We claim:

1. A power converter comprising:

a first self-quenching semiconductor switching element having a first terminal and a second terminal, the first terminal of the first switching element being connected to a first terminal of a power supply during operation of the power converter;

a second self-quenching semiconductor switching element having a first terminal and a second terminal, the first terminal of the second switching element being connected to the second terminal of the first switching element at a junction point between the first switching element and the second switching element, the second terminal of the second switching element being connected to a second terminal of the power supply during operation of the power converter;

a first diode having a first terminal and a second terminal, the first terminal of the first diode being connected to the first terminal of the power supply during operation of the power converter;

a second diode having a first terminal and a second terminal, the second terminal of the second diode being connected to the second terminal of the power supply during operation of the power converter; and a first capacitive element, a second capacitive element, and a third capacitive element connected to each other in either a delta configuration or a star configuration to form a capacitive circuit having a first terminal, a second terminal, and a third terminal, the first terminal of the capacitive circuit being connected to the second terminal of the first diode, the second terminal of the capacitive circuit being connected to the first terminal of the second diode, and the third terminal of the capacitive circuit being connected to the junction point between the first switching element and the second switching element.

\* \* \* \* \*